US009490382B2

(12) United States Patent
Hashimoto

(10) Patent No.: US 9,490,382 B2
(45) Date of Patent: Nov. 8, 2016

(54) SOLAR MODULE AND MANUFACTURING METHOD THEREFOR

(71) Applicant: Sanyo Electric Co., Ltd., Moriguchi, Osaka (JP)

(72) Inventor: Haruhisa Hashimoto, Minoh (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/132,464

(22) Filed: Dec. 18, 2013

(65) Prior Publication Data

US 2014/0130841 A1 May 15, 2014

Related U.S. Application Data

(63) Continuation of application No. PCT/JP2012/056847, filed on Mar. 16, 2012.

(30) Foreign Application Priority Data

Jun. 30, 2011 (JP) ................................. 2011-146157

(51) Int. Cl.
*H01L 31/05* (2014.01)
*H01L 31/18* (2006.01)

(52) U.S. Cl.
CPC ....... *H01L 31/0504* (2013.01); *H01L 31/0508* (2013.01); *H01L 31/0512* (2013.01); *H01L 31/18* (2013.01); *Y02E 10/50* (2013.01)

(58) Field of Classification Search
None
See application file for complete search history.

(56) References Cited

U.S. PATENT DOCUMENTS

| | | | |
|---|---|---|---|
| 6,175,075 B1* | 1/2001 | Shiotsuka et al. ............ | 136/251 |
| 6,320,115 B1* | 11/2001 | Kataoka et al. .............. | 136/251 |
| 2003/0127128 A1* | 7/2003 | Fabick ............... | H01L 31/0392 |
| | | | 136/256 |
| 2004/0200522 A1* | 10/2004 | Fukawa et al. ............... | 136/259 |
| 2007/0125415 A1* | 6/2007 | Sachs ............................ | 136/205 |
| 2007/0235077 A1* | 10/2007 | Nagata et al. ................ | 136/256 |
| 2009/0032081 A1* | 2/2009 | Saita et al. .................... | 136/244 |

(Continued)

FOREIGN PATENT DOCUMENTS

| | | |
|---|---|---|
| JP | 62-042468 A | 2/1987 |
| JP | H11-214733 A | 8/1999 |

(Continued)

OTHER PUBLICATIONS

Sun, "Effect of Projection Height on Projection Collapse and Nugget Formation—A Finite Element Study," Welding Research (Sep. 2011), pp. 211-216.*

*Primary Examiner* — Allison Bourke
*Assistant Examiner* — William E McClain
(74) *Attorney, Agent, or Firm* — Mots Law, PLLC

(57) ABSTRACT

A solar module is provided which has improved output characteristics. The solar module (1) includes a first protecting member (21), a second protecting member (22), a first solar cell (10*a*) and a second solar cell (10*b*), and a first wiring member (11A). The first solar cell (10*a*) and the second solar cell (10*b*) are arranged between the first protecting member (21) and the second protecting member (22). The first wiring member (11A) electrically connects the first solar cell (10*a*) to the second solar cell (10*b*). A first conductive member (17*a*) is arranged on the same surface of the first solar cell (10*a*) as the second protecting member (22). The tip of protrusion portions (11*c*) formed on the surface of the first wiring member (11A) and the first conductive member (17*a*) are connected electrically by welding.

6 Claims, 2 Drawing Sheets

(56) References Cited

U.S. PATENT DOCUMENTS

| | | | |
|---|---|---|---|
| 2009/0038675 A1* | 2/2009 | Tsunomura et al. | 136/251 |
| 2009/0288697 A1* | 11/2009 | Shimizu et al. | 136/244 |
| 2010/0084001 A1* | 4/2010 | Tsunomura | H01L 31/0747 |
| | | | 136/244 |
| 2010/0181011 A1* | 7/2010 | Hashimoto et al. | 156/166 |
| 2011/0048492 A1* | 3/2011 | Nishiwaki | 136/244 |
| 2012/0048336 A1* | 3/2012 | Ito | 136/244 |
| 2013/0247958 A1* | 9/2013 | Hanai et al. | 136/244 |

FOREIGN PATENT DOCUMENTS

| | | | |
|---|---|---|---|
| JP | 2003-338633 A | 11/2003 | |
| JP | 2004-281797 A | 10/2004 | |
| JP | 2005-251960 A | 9/2005 | |
| JP | 2006-013406 A | 1/2006 | |
| JP | 2007-214533 A | 8/2007 | |
| JP | 2009-295940 A | 12/2009 | |
| JP | 2010-140984 A | 6/2010 | |
| WO | WO 2010001905 A1 * | 1/2010 | ....... H01L 31/02008 |
| WO | WO 2010125874 A1 * | 11/2010 | ......... H01L 31/0352 |

\* cited by examiner

SOLAR MODULE AND MANUFACTURING METHOD THEREFOR

CROSS-REFERENCE TO RELATED APPLICATIONS

This is a continuation of International Application PCT/JP2012/056847, with an international filing date of Mar. 16, 2012, filed by applicant, the disclosure of which is hereby incorporated by reference in its entirety.

FIELD OF THE INVENTION

The present invention relates to a solar module and to a manufacturing method therefor.

BACKGROUND

Interest in solar modules has increased in recent years as an energy source with a low environmental impact. Solar modules are usually provided with a solar cell string having a plurality of solar cells connected electrically by wiring members.

Conventionally, the solar cells are most often bonded to the wiring member using solder. However, in order to bond the solar cells to the wiring member using solder, the solder has to be melted. As a result, the temperature of the solar cells rises and solar cells are often damaged or deformed in bonding step between the solar cell and the wiring member.

In view of this problem, the bonding of solar cells to a wiring member using a conductive resin adhesive has been studied as seen, for example, in Patent Document 1. Because conductive adhesives can lower the temperature of the bonding step as compared to solder, damage and deformation of solar cells can be suppressed.

PRIOR ART DOCUMENTS

Patent Documents

Patent Document 1: Laid-Open Patent Publication No. 2009-295940

SUMMARY

Problem Solved by the Invention

However, solar cells are sometimes damaged in the solar module manufacturing process. When a solar cell in a solar cell string has been damaged, the damaged solar cell has to be replaced by a new solar cell.

When a new solar cell is incorporated into a solar cell string, the new solar cell has to be connected electrically to the existing solar cells using a wiring member. One method under consideration for connecting a new solar cell electrically to existing solar cells using a wiring member is to electrically connect and bond the wiring member remaining on the existing solar cells to a wiring member connected electrically to the new solar cell using solder or a conductive resin adhesive.

However, this method results in the problem of the output characteristics of a solar module becoming low.

It is an object of the present invention to provide a solar module and a manufacturing method for a solar module which has improved output characteristics.

Means of Solving the Problem

The solar module of the present invention includes a first protecting member, a second protecting member, a first solar cell and a second solar cell, and a first wiring member. The first solar cell and the second solar cell are arranged between the first protecting member and the second protecting member. The first wiring member is connected electrically to the first solar cell and the second solar cell. A first conductive member is arranged on the surface of the first solar cell on the same side as the second protecting member. The tip of a protruding portion on the surface of the first wiring member and the first conductive member are connected electrically by welding.

In the manufacturing method for a solar module according to the present invention, a connection step is performed in which a plurality of solar cells are connected electrically using a wiring member having a plurality of protruding portions on one surface. Also, a replacement step is performed in which one solar cell among the plurality of solar cells is replaced. In the replacement step, the one solar cell is replaced by a new solar cell, which is electrically connected by welding the tip of a protruding portion connected to the new solar cell to the wiring member connected to the solar cell adjacent to the new solar cell.

Effect of the Invention

The present invention is able to provide a solar module having improved output characteristics.

DETAILED DESCRIPTION

Figure 1:
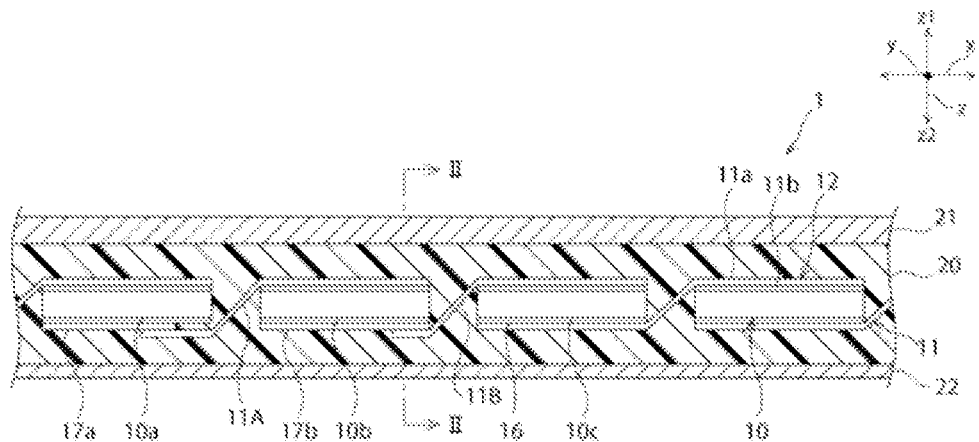
FIG. 1 is a simplified cross-sectional view of the solar module in an embodiment.

The following is an explanation of an example of a preferred embodiment of the present invention. The following embodiment is merely an example. The present invention is not limited to the following embodiment in any way.

Further, in each of the drawings referenced in the embodiment, members having substantially the same function are denoted by the same symbols. The drawings referenced in the embodiment are also depicted schematically. The dimensional ratios of the objects depicted in the drawings may differ from those of the actual objects. The dimensional ratios of objects may also vary between drawings. The specific dimensional ratios of the objects should be determined with reference to the following explanation.

1st Embodiment

Solar Module 1

As shown in FIG. 1, the solar module 1 in the present embodiment includes a first protecting member 21, a second protecting member 22, and a plurality of solar cells 10 sealed inside a sealing member 20 between the first protecting member 21 and the second protecting member 22.

The first protecting member 21 has transparent properties and is used to protect the light-receiving surface of the solar cells 10. The first protecting member 21 can be a plate with transparent properties such as a glass plate or a transparent plastic plate. At least some of the light incident on the solar module 1 that passes through the first protecting member 21 is incident on the light-receiving surface of the solar cells 10.

The second protecting member 22 is used to protect the back surface of the solar cells 10. The second protecting member 22 is a weatherproof member such as a weatherproof resin film or a multilayer film in which metal foil is interposed between a pair of resin films.

The sealing member 20 can be a resin material such as an ethylene/vinyl acetate copolymer (EVA), polyvinylbutyral (PVB, polyethylene (PE), and polyurethane (PU).

The solar module 1 may also have a terminal box on the surface of the second protecting member 22 to extract the electrical power generated by the solar cells 10. It may also have a metal or resin frame on the peripheral edges.

The solar cells 10 are connected electrically by wiring members 11. The solar cells 10 are arranged in a first direction (the x-direction) and are connected electrically by wiring members 11 to create a solar cell string 12. The solar cell string 12 includes a first solar cell 10a, a second solar cell 10b, and a third solar cell 10c. The second solar cell 10b is a new solar cell which has replaced another solar cell in the replacement step described below. The connection structure of the wiring member 11 to the newly replaced second solar cell 10b differs from the connection structure of the wiring member 11 to the third solar cell 10c. In other words, the solar cell string 12 has a solar cell 10 among the plurality of solar cells 10 which has a different connection structure to the wiring member 11.

Figure 2:
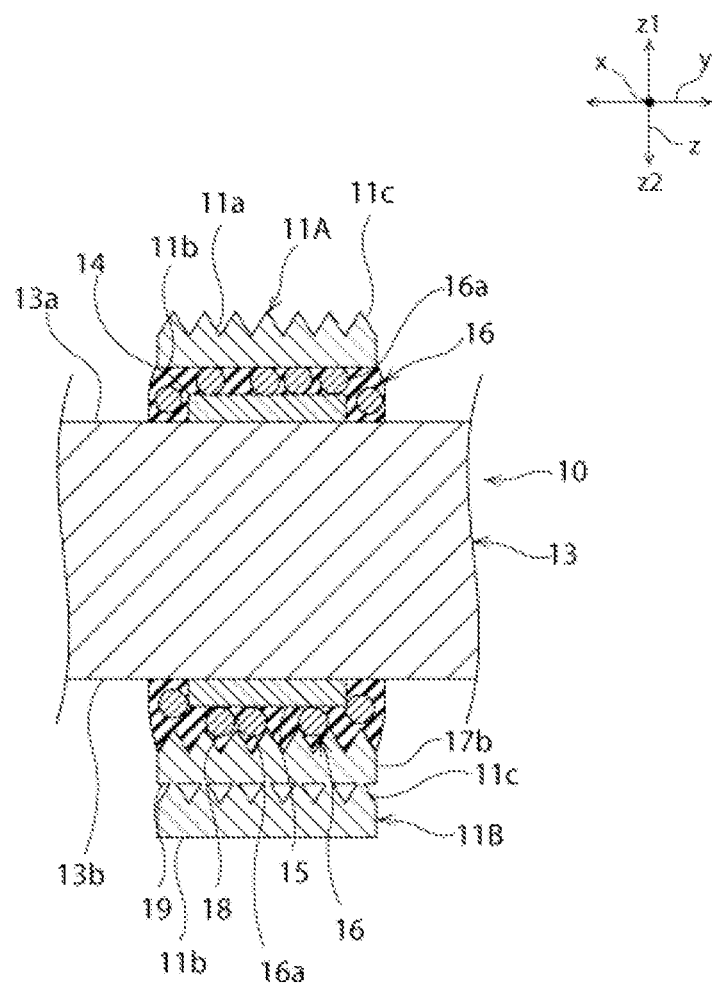
FIG. 2 is a simplified cross-sectional view of a solar cell string from line II-II in FIG. 1.

There are no particular restrictions on the type of solar cell 10. The solar cell 10 can be, for example, a crystalline silicon solar cell. In the present embodiment, as shown in FIG. 2, a solar cell 10 includes a photoelectric conversion unit 13 having a first main surface 13a and a second main surface 13b, a first electrode 14 arranged on the first main surface 13a, and a second electrode 15 arranged on the second main surface 13b.

The inside of the photoelectric conversion unit 13 has a pn junction to generate carriers (electrons and holes) from the received light. The first main surface 13a is composed of a semiconductor layer of one type of conductivity or a conductive layer such as a transparent conductive layer provided on top of this semiconductor layer. The second main surface 13b is composed of a semiconductor layer of the other type of conductivity or a conductive layer provided on top of this semiconductor layer.

In the solar cell 10, light is received primarily by the first main surface 13a. Therefore, the first main surface 13a is called the light-receiving surface, and the second main surface 13b is sometimes called the back surface. The first main surface 13a is provided on the same side as the first protecting member 21. The solar cell 10 may generate electricity from light received only on the first main surface 13a, or it may be bifacial and generate electricity from light received on both the first main surface 13a and the second main surface 13b.

The wiring member 11 has a first main surface 11a and a second main surface 11b. The wiring member 11 has a plurality of protruding portions 11c on the first main surface 11a. In the wiring member 11, the first main surface 11a faces the first protecting member 21, and the second main surface 11b faces the second protecting member 22. In the present embodiment, the second main surface 11b of the wiring member 11 is substantially flat. The cross-sectional shape of the protruding portions 11c does not have to be triangular. It may be any shape capable of reflecting incident light in an oblique direction. The plurality of protruding portions 11c may be provided so as to be continuous in the longitudinal direction of the wiring member 11, or may be provided so as to be distributed over the surface of the wiring member 11 in the shape of a substantially square pyramid. The second main surface 11b of the wiring member 11 may also have a plurality of protruding portions.

The wiring member 11 includes a suitably conductive material. This material may be a metal such as silver or copper, or an alloy. The wiring member 11 may be provided with a wiring body of copper or a copper alloy with a plurality of protruding portions on the surface, and a silver layer provided on the surface of the wiring body so as to cover at least the surface of the protruding portions.

Usually, the wiring member 11 and the solar cells 10 are bonded using an adhesive layer 16. In the present invention, the adhesive layer 16 has a cured adhesive resin, and a plurality of conductive members 16a distributed inside the resin. The cured adhesive resin bonds the wiring member 11 and the solar cells 10. At least one of the conductive members 16a makes contact with both the wiring member 11 and the first electrode 14. The conductive member 16a making contact with both the wiring member 11 and the first electrode 14 electrically connects the wiring member 11 and the first electrode 14. Similarly, a conductive member 16a making contact with both the wiring member 11 and the second electrode 15 electrically connects the wiring member 11 and the second electrode 15. At least a portion of the surfaces of the wiring member 11 and the first electrode 14 may come into direct contact to establish an electrical connection between them. Similarly, at least a portion of the surfaces of the wiring member 11 and the second electrode 15 may come into direct contact to establish an electrical connection between them. In such cases, a conductive member 16a is not required.

As mentioned above, the solar cells 10 include a first solar cell 10a, a second solar cell 10b and a third solar cell 10c arranged in the x-direction in this order. As shown in FIG. 1, the first solar cell 10a and the second solar cell 10b are connected electrically by wiring member 11A. The second solar cell 10b and the third solar cell 10c are connected electrically by wiring member 11B.

Conductive member 17a connected electrically to the second electrode 15 is arranged on the surface of the second protecting member 22 in the first solar cell 10a. Also, conductive member 17b connected electrically to the second electrode 14 is arranged on the surface of the second protecting member 22 in the second solar cell 10b. Conductive member 17a and conductive member 17b have a plurality of protruding portions 18 on the surface facing solar cell 10b and solar cell 10c, and the surface facing the second protecting member 22 has a flat surface 19. The conductive members have the same shape as the wiring members.

As in the case of the wiring member 11, conductive member 17a is usually bonded to solar cell 10a by an adhesive layer 16. Conductive member 17b is also usually bonded to solar cell 10b by an adhesive layer 16. As in the case of the wiring member 11, conductive member 17a and conductive member 17b are made of a suitable conductive material, including metals such as silver and copper, or an alloy. Conductive member 17a and conductive member 17b may be provided with a wiring body comprising copper or a copper alloy, and a silver layer covering the surface of the wiring body.

The first solar cell 10a and the second solar cell 10b are connected electrically by welding the flat portion 19 of the conductive member 17a to the protruding portions 11c of the wiring member 11A connected electrically to the second solar cell 10b. The sections of the wiring member 11A between the protruding portions 11c preferably include sections which are not welded to the conductive member 17a. This can form gaps between the wiring member 11A and the sections of the conductive member 17a between the protruding portions 18. More specifically, in the present embodiment, the tips of the protruding portions 11c are welded to the conductive member 17a in at least some of the section in which the wiring member 11A and the conductive member 17a overlap in the z-direction (the thickness direction). In other words, the wiring member 11A and the conductive member 17a include a portion which is welded in one section in the y-direction, which intersects the direction in which the wiring member 11A and the conductive member 17a extend. Further, the portions where the wiring member 11A and the conductive member 17a overlap in the z direction also include sections in which the wiring member 11A and the conductive member 17a are not welded.

The second solar cell 10b and the third solar cell 10c are connected electrically by welding the flat portion 19 of the conductive member 17b to the tips of the protruding portions 11c of the wiring member 11B connected electrically to the third solar cell 10c. This includes portions between each protruding portion 11c of the wiring member 11B which are not welded to the conductive member 17b. This can form gaps between the wiring member 11B and the sections of the conductive member 17b between the protruding portions 18. More specifically, in the present embodiment, the tips of the protruding portions 11c are welded to the conductive member 17b in at least some of the section in which the wiring member 11B and the conductive member 17b overlap in the z-direction. In other words, the wiring member 11B and the conductive member 17b include a portion which is welded in one section in the y-direction, which intersects the x-direction or the direction in which the wiring member 11B and the conductive member 17b extend. Further, the portions where the wiring member 11B and the conductive member 17b overlap in the z direction also include sections in which the wiring member 11A and the conductive member 17a are not welded.

Manufacturing Method For Solar Module 1

The following is an explanation of an example of a manufacturing method for this solar module 1.

Figure 3:
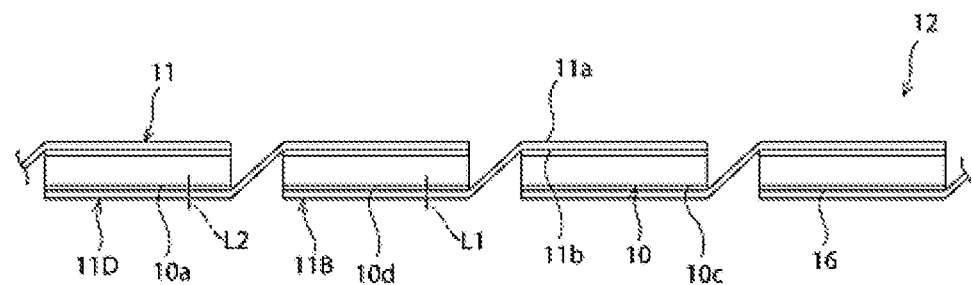
FIG. 3 is a simplified side view used to explain the manufacturing process for the solar module in an embodiment.

First, as shown in FIG. 3, the plurality of solar cells 10 are connected electrically using wiring members 11 (connection step). This creates at least one electrically connected solar cell string 12. More specifically, these are connected electrically by bonding a wiring member 11 to two solar cells 10 using a resin adhesive. Next, the solar cell 10 connected to the wiring member 11 is connected electrically to another solar cell 10 by bonding the wiring member 11 to the other solar cell using a resin adhesive. These steps are repeated to electrically connect a plurality of solar cells 10 using wiring members 11.

Next, each of the electrically connected solar cells 10 is inspected for damage (inspection step). There are no particular restrictions on the method used to inspect the solar cells 10. For example, the solar cells 10 can be inspected visually.

In the explanation of the example of the present embodiment, only solar cell 10d arranged between solar cell 10a and solar cell 10c has been found to be damaged. Of course, more than one solar cell may be found to be damaged in the inspection step.

In the present invention, "new solar cell" does not only refer to unused solar cells. As long as the solar cell is undamaged, the "new solar cell" may be an unused solar cell or a solar cell that was used once before in the manufacture of a solar cell string.

Figure 4:
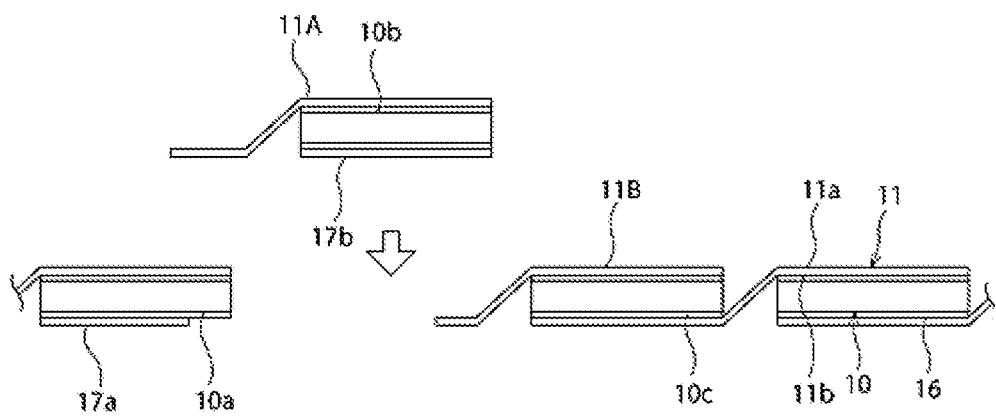
FIG. 4 is a simplified side view used to explain the manufacturing process for the solar module in an embodiment.

Next, the solar cell 10d found to be damaged is replaced by a new solar cell 10b as shown in FIG. 4 (replacement step). In this way, a solar cell string 12 free of damaged solar cells is created.

Afterwards, first protecting member 21, a resin sheet constituting a portion of the sealing member 20, a solar cell string 12, a resin sheet constituting the remaining portion of the sealing member 20, and a second protecting member 22 are stacked and then laminated to complete a solar module 1.

The following is a more detailed explanation of the replacement step in the present embodiment. In the replacement step of the present embodiment, a solar cell 10d found to be damaged is replaced by a new solar cell 10b. More specifically, in the present invention, the portion of the solar cell 10d bonded to the wiring member 11B is severed along cutting line L1, and wiring member 11D is severed along cutting line L2. In this way, solar cell 10d is removed from the solar cell string 12 and a conductive member 17a is created which is composed of wiring member 11D.

Next, a solar cell 10b is prepared. In the solar cell 10b, a conductive member 17b is bonded to the second main surface 13b using an adhesive layer 16, and wiring member 11A is bonded to the first main surface 13a using a bonding layer 16. Solar cell 10b is arranged between solar cell 10a and solar cell 10c. The conductive member 17b is created by cutting the wiring member 11 to the desired length.

Next, the tips of the protruding portions 11c of wiring member 11A are welded to the flat portion 19 of conductive member 17a, and the tips of the protruding portions 11c of wiring member 11B are welded to the flat portion 19 of conductive member 17b. In this way, wiring member 11A is electrically connected to conductive member 17a, and wiring member 11B is electrically connected to conductive member 17b. As a result, a solar cell string 12 free of damaged solar cells can be obtained.

The tips of the protruding portions 11c are preferably welded to conductive member 11A in the portion in which wiring member 11A and conductive member 17a overlap. Also, the tips of the protruding portions 11c are preferably welded to conductive member 11B in the portion in which wiring member 11B and conductive member 17b overlap.

The welding can be performed by applying electricity between a pair of electrodes making contact with wiring member 11A or wiring member 11B. At this time, the electricity is preferably applied so that unwelded portions remain between the protruding portions 11c of wiring member 11A. Similarly, the electricity is preferably applied so that unwelded portions remain between the protruding portions 11c of wiring member 11B.

The wiring members and conductive members may also be connected using solder. However, in this case, the solder has to be melted. As a result, the solar cells, wiring members, and the adhesive between the wiring members and solar cells are subjected to heat. This reduces the bonding strength of the adhesive between the solar cells and the wiring members, and lowers the reliability and output characteristics of the solar module.

In the present embodiment, conductive member 17a and wiring member 11A are connected by welding the flat portion 19 of conductive member 17a to the tips of the protruding portions 11c of wiring member 11A. At this time, the welding is performed so as to leave unwelded portions between the protruding portions 11c of wiring member 11A. Similarly, conductive member 17b and wiring member 11B are connected by welding the flat portion 19 of conductive member 17b to the tips of the protruding portions 11c of wiring member 11B. At this time, the welding is also performed so as to leave unwelded portions between the protruding portions 11c of wiring member 11B. As a result, conductive member 17a and conductive member 17b can be connected to wiring members 11A and 11B in a short period of time, and conductive member 17a, conductive member 17b and the adhesive layers 16 are unlikely to be subjected to heat. Therefore, in the connection step between the conductive members 17a, 17b and the wiring members 11A, 11B, the bonding strength of the adhesive layer 16 between the wiring members 11 and the solar cell 10 is unlikely to be weakened, and any reduction in reliability and output characteristics can be suppressed. As a result, improved output characteristics can be obtained.

Also, in the present embodiment, the tips of the protruding portions 11c are bonded to conductive member 17a in the portion where wiring member 11A and conductive member 17a overlap. In addition, the tips of the protruding portions 11c are bonded to conductive member 17b in the portion where wiring member 11B and conductive member 17b overlap. In this way, the adhesive layers 16 and other members are effectively prevented from being subjected to heat in the welding step. As a result, improved output characteristics can be obtained.

There is a significant reduction in the bonding strength of the adhesive layer 16 due to heat when the adhesive layer 16 is a resin adhesive layer that is when the solar cells are bonded to wiring members 11 using a resin adhesive. Therefore, the technique in the present embodiment is especially effective when the adhesive layers 16 are resin adhesive layers.

The present embodiment, unlike a situation in which conductive members 17a, 17b and wiring members 11 are connected using solder, does not require flux. Therefore, processing costs can be reduced.

The present invention includes various embodiments not described herein. For example, the wiring members and the conductive members may each have a plurality of protruding portions on both main surfaces.

The wiring members, conductive members and solar cells may be bonded using a resin adhesive that is free of conductive particles. In other words, the wiring members, conductive members and solar cells may be bonded using a resin adhesive layer made of a cured resin adhesive that is free of conductive particles. In this case, the wiring members, the conductive members and the electrodes of the solar cells are preferably bonded so as to come into direct contact. The wiring members, conductive members and solar cells may also be bonded using an adhesive other than a resin adhesive, such as solder.

The present invention includes many other embodiments not described herein. Therefore, the technical scope of the present invention is defined solely by the items of the invention specified in the claims pertinent to the above explanation.

KEY TO THE DRAWINGS

1: Solar module
10, 10a, 10b, 10c, 10d: Solar cell
11, 11A, 11B, 11C: Wiring member
11c: Protruding portion
12: Solar cell string
13: Photoelectric conversion unit
13a: 1st main surface
13b: 2nd main surface
14: 1st electrode
15: 2nd electrode
16: Adhesive layer
16a: Conductive member
17a, 17b: Conductive member
18: Protruding portion
19: Flat portion
20: Sealing member
21: 1st protecting member
22: 2nd protecting member

What is claimed is:

1. A solar module comprising:
a first protecting member,
a second protecting member,
a first solar cell, and a second solar cell arranged between the first protecting member and the second protecting member,
a first conductive member formed on a surface of the first solar cell on the same side as the second protecting member and connected by an adhesive layer, wherein the adhesive layer comprises a resin adhesive, and
a first wiring member electrically connecting the first solar cell and the second solar cell, the first wiring member comprising a concave portion and a protruding portion on a surface facing the first protecting member, wherein
the protruding portion of the first wiring member is welded to and faces the first conductive member in an overlap section of the first wiring member and the first conductive member,
the concave portion of the first wiring member in the overlap section is not welded to and faces the first conductive member, and
the first wiring member and the second solar cell are connected by an adhesive layer on the same side as the first protecting member, wherein the adhesive layer comprises a resin adhesive.

2. A solar module comprising:
a first protecting member,
a second protecting member,
a first solar cell, and a second solar cell arranged between the first protecting member and the second protecting member,
a first conductive member formed on a surface of the first solar cell on the same side as the second protecting member and connected by an adhesive layer, wherein the adhesive layer comprises a resin adhesive, and
a first wiring member electrically connecting the first solar cell and the second solar cell, the first wiring member comprising a concave portion and a protruding portion on a surface facing the first protecting member,
wherein the first wiring member has a body with a silver surface,
the protruding portion of the first wiring member is welded to and faces the first conductive member in an overlap section of the first wiring member and the first conductive member,
the concave portion of the first wiring member in the overlap section is not welded to and faces the first conductive member, and the first wiring member and the second solar cell are connected by an adhesive layer on the same side as the first protecting member, wherein the adhesive layer comprises a resin adhesive.

3. The solar module according to claim 1, wherein the first wiring member comprises a protruding portion on a surface on the same side as the second protecting member.

4. The solar module according to claim 2, wherein the first wiring member comprises a protruding portion on a surface on the same side as the second protecting member.

5. The solar module according to claim 1, further comprising:
   a third solar cell arranged between the first protecting member and the second protecting member;
   a second wiring member electrically connecting the second solar cell and the third solar cell, the second wiring member comprising a concave portion and a protruding portion on a surface facing the first protecting member, wherein
   the second wiring member and the third solar cell are connected by an adhesive layer on the same side as the first protecting member, and
   the second wiring member and the second solar cell are connected by an adhesive layer on the same side as the second protecting member.

6. The solar module according to claim 5, further comprising:
   a fourth solar cell arranged between the first protecting member and the second protecting member;
   a second conductive member formed on a surface of the fourth solar cell on the same side as the second protecting member and connected by an adhesive layer,
   a third wiring member electrically connecting the first solar cell and the fourth solar cell, the third wiring member comprising a concave portion and a protruding portion on a surface facing the first protecting member, wherein
   the protruding portion of the third wiring member is welded to and faces the second conductive member in an overlap section of the third wiring member and the second conductive member, and
   the third wiring member and the first solar cell are connected by an adhesive layer on the same side as the first protecting member.

* * * * *